United States Patent [19]
Dux et al.

[11] Patent Number: 5,741,142
[45] Date of Patent: Apr. 21, 1998

[54] GROUND BUS COUPLING MODULE

[75] Inventors: Dietmar Dux; Walter Hanning, both of Detmold; Uwe Fiene, Steinheim; Michael Schnatwinkel, Herford; Rudolf Steinmeier; Manfred Wilmes, both of Detmold; Christian Hamann, Holzminden; Eckhard Beins, Detmold; Christoph Zebermann, Beverungen; Hans-Georg Glathe, Detmold; Martin Herms, Lemgo; Matthiass Liesenjohann, Lage; Stefan Steinkämper, Detmold; Bernhard Schuster, Detmold; Gerhard Eggert, Detmold, all of Germany

[73] Assignee: Weidmüller Interface GmbH & Co.

[21] Appl. No.: 549,069

[22] Filed: Oct. 27, 1995

[30] Foreign Application Priority Data

Oct. 31, 1994 [DE] Germany ............... 44 38 805.5

[51] Int. Cl.⁶ .................................................. H01R 9/26
[52] U.S. Cl. ...................... 439/76.1; 439/94; 439/716
[58] Field of Search ................... 439/44, 49, 76.1, 439/76.2, 716, 717, 709

[56] References Cited

FOREIGN PATENT DOCUMENTS 3026247  11/1983  Germany .

*Primary Examiner*—Gary F. Paumen
*Attorney, Agent, or Firm*—Laubscher & Laubscher

[57] ABSTRACT

A field bus connection module for coupling a local bus conductor to an associated field bus system includes a housing formed from functionally different, alignable terminal blocks, and spacing elements. The terminal blocks comprise a feed block and a grounded conductor block. Removably connected with the housing is at least one functional printed circuit board. Removal of the functional printed circuit board necessarily interrupts a separable connection between the local bus conductor and the field bus, although the field bus continues to be connected to the functional printed circuit board.

25 Claims, 4 Drawing Sheets

GROUND BUS COUPLING MODULE

BACKGROUND OF THE INVENTION

The present invention relates to a ground or field bus connection module for coupling a local bus conductor to an associated field bus system.

In control systems, electrical wiring for the system is increasingly provided in the form of a field bus system that connects many local stations or zones of the systems. Local initiators, actuators, field units or the like are connected to switch casings—that are also arranged locally in the vicinity of these installations—by conventional wiring techniques. In such local switch casings, there is a conversion of signals to and from the initiators, actuators, field units or the like to an internal bus system and the internal bus system is connected to a field bus system via a network nodal point. The cables running to the initiators, actuators, field units or the like that converge in the locally arranged switch casing are guided to connection blocks that make it physically possible to tie the cables to the required electrical potentials. Moreover, they permit the signals applied to the connection blocks to be adapted to a local bus conductor system.

Such bus conductor systems are provided to connect a number of connection or terminal blocks arranged on a common mounting rail. Each of the individual connection blocks can be connected to the local bus conductor system via an electronics module. The local bus conductor systems in such a switch casing that is arranged near the machine are brought together for connection to the field bus system on one or several field bus connection modules that take care of the signal conversion of the local bus conductor system to the signal type of the field bus system. At the modules, local bus conductor systems that usually come from specific manufacturers are adapted to a standardized system that is made up of a number of different possible field bus systems. From the particular field bus connection module that is specific for the particular bus conductor and that can be connected in the form of a network node with a field bus cable arranged, for example, in a ring-shaped or bus-shaped pattern, the signals are transmitted to the control unit, such as via a stored-program control. Similarly, the control unit also transmits signals for the initiators, actuators, field units or the like on the spot to the field bus connection module where those signals are converted to the signal level of the internal bus conductor. In the electronics module, they are converted to the signal level of the initiator, actuator, or field unit.

Commercially available field bus connection modules usually comprise an electronics part that is placed in a closed housing and that customarily includes one or several plates and that have connecting elements, such as plug-in devices or the like, for the purpose of establishing a connection between the field bus and the field bus connection module. Usually, within the field bus connection module, a connection is established to the local bus conductor system by means of a bus conductor plate or intermediate plug-in devices such as ribbon cables with flat plugs. The connection is guided to the connection block. Such field bus connection modules are designed for specific field bus systems and represent a compact system that is aligned with the connection blocks on a mounting rail as a unit. The rather large field bus connection modules of the kind involved must be uncoupled mechanically and electrically from the network of the field bus system and from their associated connection blocks to separate the area of the connection block that is associated with the network nodal point for maintenance. In this way, the function of the entire field bus system and thus a large number of functions on the machine or the system are neutralized. Commercially available field bus connection modules must therefore be bridged for maintenance purposes by means of bridging devices, such as connecting cables or separate maintenance units for the period of the maintenance work. This means that the machine or system must be taken out of operation at least for a short time. By virtue of the fact that the electronics sector is typically arranged in an inaccessible fashion within the closed housing, maintenance is possible only if the field bus connection module is completely mechanically taken out of service. In other words, exchanging individual components or parts of the field bus connection module, as a rule, is impossible to achieve on location.

German Patent No. 30 26 247 discloses an assembly arranged in a housing for holding a plurality of electronic structural members in such a manner that due to the simple exchangeability of the circuit board and a simpler way of varying the electrical connections, one can avoid restricting the housing size to the structural depth of the components that can be aligned next to each other. There is no need for connecting clamps having angled connections. This problem is solved by a housing that can be aligned in series and that can hold a plurality of electronic structural members. The housing includes side walls formed of side wall segments that are arranged in a staggered manner from the outside to the inside in a pattern of several steps molded upon a rear wall. The housing also includes a front wall, into which at least one circuit board that supports the electronic structural members can be inserted. The electrical connection elements arranged along the edges of the circuit board protrude out of openings in the housing located between the side wall segments. The front wall is removably attached to the side wall segments, while each of the side wall segments in the area of the openings that are open toward the front wall are provided with an inwardly extending groove parallel to the direction of alignment for receiving the circuit boards, whereby the length of the circuit boards in each case corresponds to the interval between two mutually opposed grooves. This prior housing, which is essentially formed in a modular fashion, thus offers receptacles for the circuit boards and the connection elements arranged thereon but— in addition to the great structural effort and rather expensive manufacture of the housing—only fixed structural lengths of the circuit boards and thus the connection elements are possible. Variation in the serial arrangement of the connection elements can be achieved only with a corresponding large number of structural forms for the housing.

SUMMARY OF INVENTION

The object of the present invention therefore is to provide a field bus connection module that is constructed in a modular fashion and that can be adapted in a simple manner to different field bus systems. The module provides various required structural bases for control electronics in order to adapt the signals, between a local bus conductor and a field bus system.

The field bus connection module of the invention includes a housing formed of a plurality of aligned terminal blocks comprising at least one feed block, at least one grounded conductor block, and a plurality of intermediate spacing elements. A first connector such as a printed circuit board, connects the housing with a local bus conductor. A functional printed circuit board which is electrically connected with the field bus system is removably connected with the housing for adapting signals of the local bus conductor to the field bus system. Second connector elements establish a separable electrical connection between the functional circuit board and the field bus system. The first connector interrupts an electrical connection between the and functional circuit board and the local bus system when the functional printed circuit board is removed from the housing with the field bus remaining connected with the functional printed circuit board.

The terminal blocks are preferably arranged in a particular sequence of at least one feed block, at least one spacing element, and at least one grounded conductor block protects the electronics of the module. Between the feed and conductor blocks, the desired number of spacing elements are arranged to define a module size sufficient to receive the functional printed circuit board which contains the circuitry to adapt the local bus signals to the field bus system.

The housing of the field bus connection module is preferably closed by a lid to which a functional printed circuit board may be removably attached. The functional printed circuit board includes all functions that are needed to connect the field bus and the local bus conductor as well as mechanical and electrical interfaces. Removal of the lid with the functional printed circuit board or the functional printed circuit board alone necessarily interrupts a connection between the local bus conductor and the field bus. However, the connections to the field bus system remain operational and the field bus is connected with the functional printed circuit board. As a result—although the lid and the functional printed circuit board have been removed from the housing—the operation of the field bus system that is tied to the functional printed circuit board is not impaired. The lid and/or the functional printed circuit board can remain connected to the field bus while the connecting blocks and the remaining portion of the housing of the field bus connection module can be maintained or repaired while it remains on a mounting rail. This operation is ensured by the functional nature of the field bus that continues to be maintained, except for the sector that is directly associated with the field bus connection module.

According to a further object of the invention, the functional circuit board has the second connector elements mounted thereon. The elements include a plug connector and a wiring connector which are electrically connected with each other. Thus, when the lid and the functional circuit board are removed, the field bus system remains connected even though the connection between the housing and the field bus system is interrupted. Moreover, the housing lid may be removed separate from the connection between the local bus conductor and the field bus system is maintained.

As noted above, the first connection device for connecting the housing module with the local bus conductor is preferably a first printed circuit board, while a second printed circuit board connects the housing with the field bus system via plug and wire connectors arranged thereon. The circuitry required for electrical coupling can be arranged on the first printed circuit board on the local bus side of the housing while the circuitry required for signal conversion can be combined on the second printed circuit board on the field bus side of the housing.

It is yet another object of the invention to provide a field bus connection module which includes distributor bars at least in the feed block. The distributor bars are cross-connected to enable tapping of electrical potential for the terminal blocks and lateral distribution of the electrical potential.

BRIEF DESCRIPTION OF THE FIGURES

Other objects and advantages of the invention will become apparent from a study of the following specification when viewed in the light of the accompanying drawing, in which.

DETAILED DESCRIPTION

Figure 1:
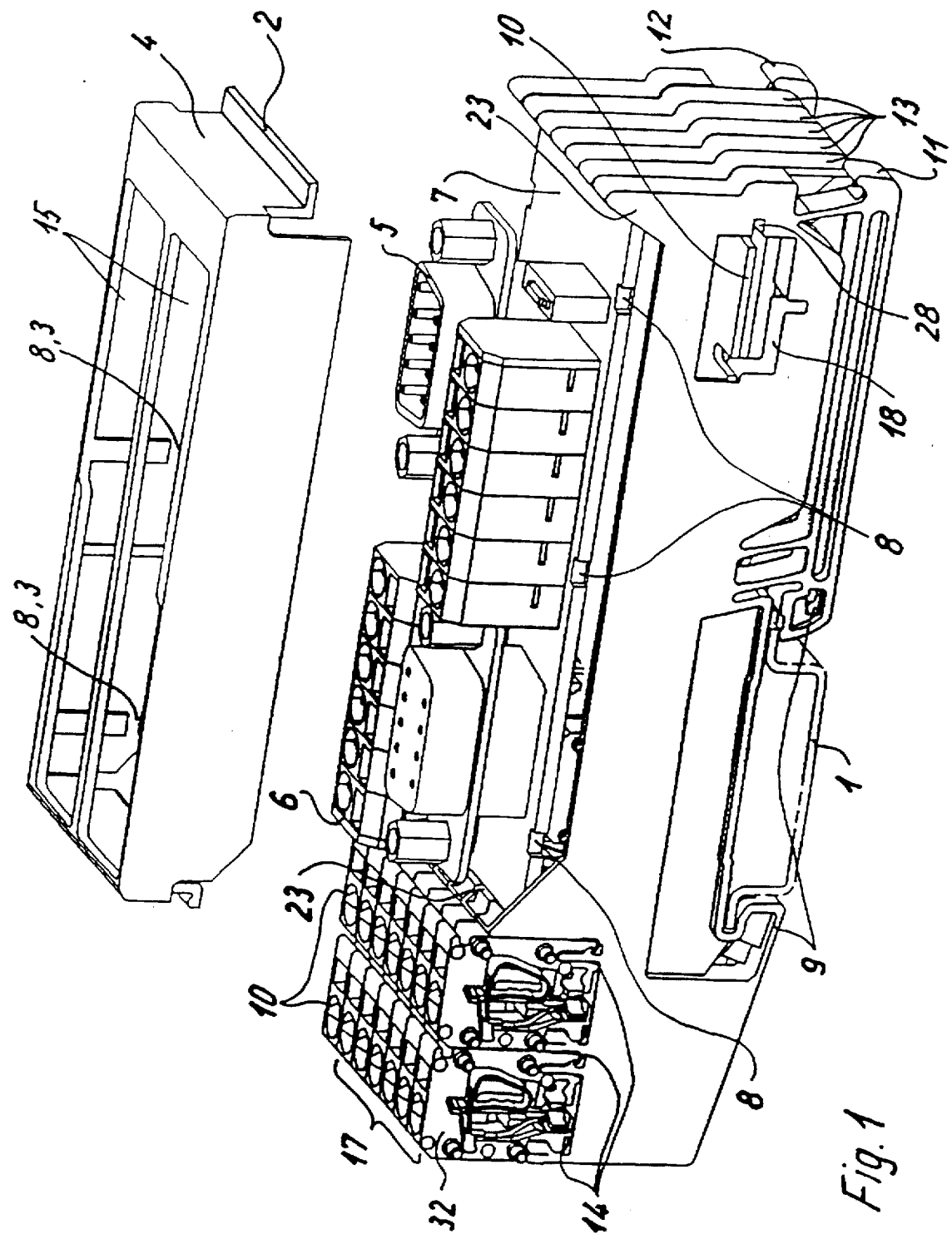
FIG. 1 is an exploded perspective view of the filed bus connection module and lid according to the invention.

There is shown in FIG. 1 a preferred embodiment of the field bus connection module according to the invention. It comprises a housing formed of an aligned array of terminal blocks including a feed block 12, a spacing element comprising a plurality of spacing discs 13, and a grounded conductor block 11. A first printed circuit board 10 is arranged within the lower portion of the housing for connection with a local bus conductor. The upper portion of the housing receives a second printed circuit board 7 for connection with a field bus system, and a lid 4 is provided to cover the second board 7. The housing is clamped onto a mounting rail 1 via catches 9 in the lower portion of the conductor block and the feed block.

To the side of the mounting rail 1 in the area of the power supply connections of a series-connected connection block (not shown), there are provided a plurality of distributors 32 that are formed of aligned individual connector elements 17 that on the housing side are mounted upon the field bus connection module by catch and guide elements 14 for the distributors 32. Connector elements 17 are electrically connected to each other by cross-connecting conductors that are arranged in the same direction as the distributors 32, while the electrical conductors extend to connectors 16 that are mounted on the feed block 12 via the catch and guidance elements 14. In the connectors 16, a supply voltage from an external voltage source is connected by way of a cable link so that a number of plug-in possibilities corresponding to the number of terminal blocks are available via the cross-distributing connector elements 17 for the voltage supply of series-connected terminal blocks on mounting rail 1.

The functional printed circuit board 7 for the field bus system includes connection elements 5, 6 on its upper surface which faces toward lid 4 for connecting the field bus connection cables not shown that pass through openings 15 in the lid 4. These connecting elements can be made as standardized field bus plugs 5 and as direct wiring bases 6 for the field bus cables on the field-bus-side functional printed circuit board 7. This is advantageous for small spaces because the standard field bus plug 5 requires a large structural height for the counterparts that are arranged on the cable side.

The connection elements 5 and 6 are associated with the input side or the output side of the field bus connection. Each element has an electrically conducting connection with the particular other input side or output side. In this manner, it is possible—even when the field-bus-side functional printed circuit board 7 has been removed—to maintain a connection between the input side and the output side of the field bus on the field bus connection module, as a result of which, the operation of the field bus is not disturbed by removing the functional printed circuit board 7 from the field bus connection module. The connection of the input side and the output side of the field bus connection is provided by way of connections on the field-bus-side functional printed circuit board 7.

Figure 2:
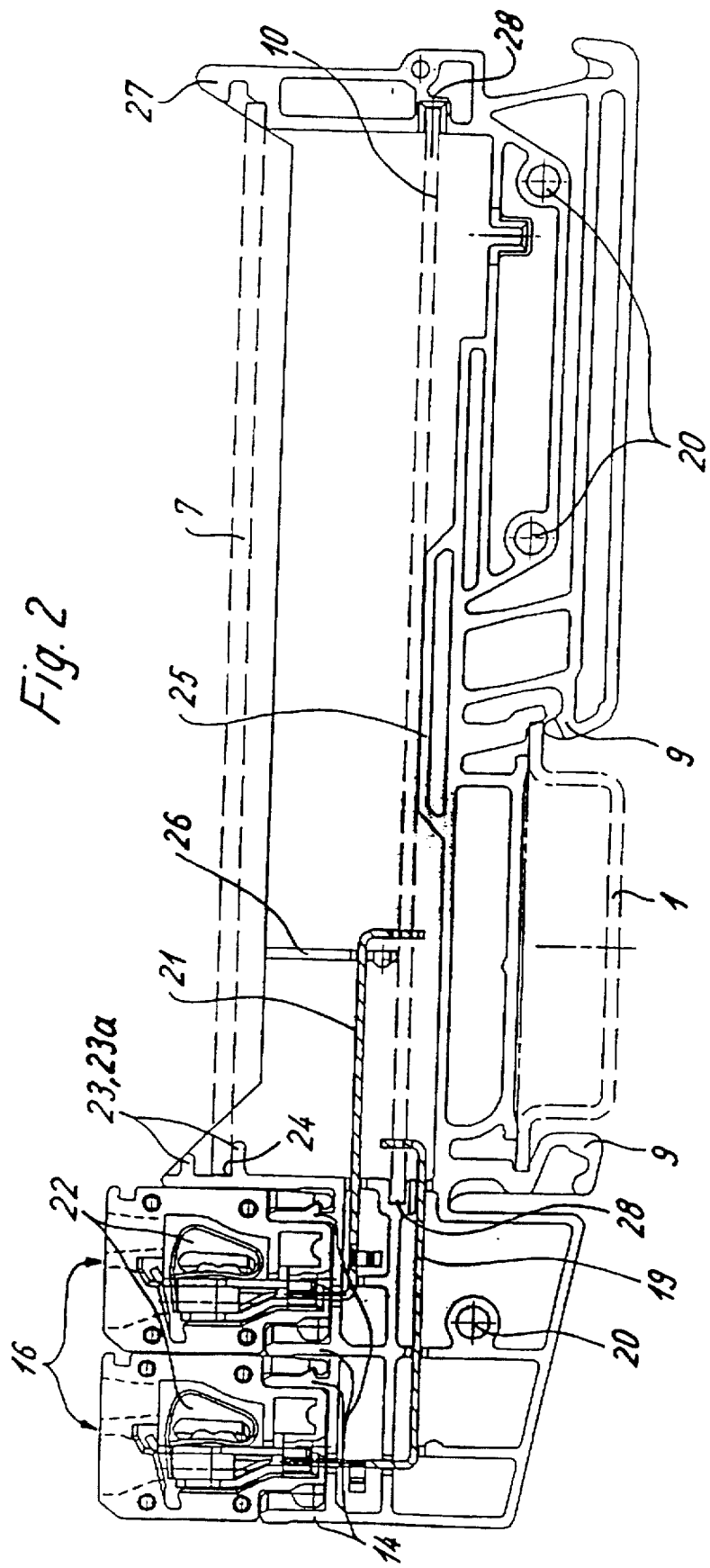
FIG. 2 is a side plan view of a feed block of the module of FIG. 1.
Figure 4:
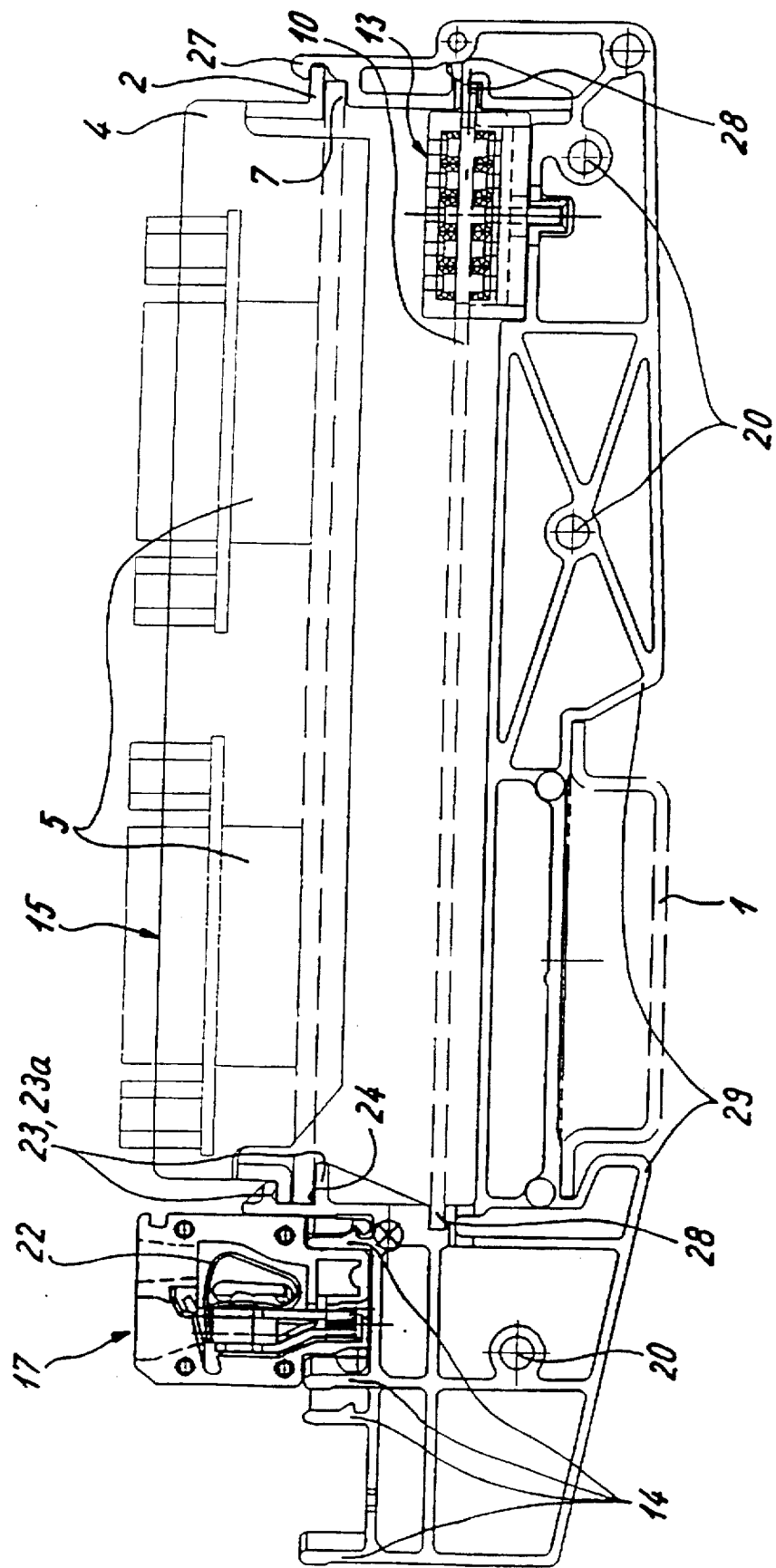
FIG. 4 is a side plan view of a spacing element of the module of FIG. 1.

As shown in FIGS. 2 and 4, functional printed circuit board 7 on the side of the field bus is swung out of the module housing around a pivot point 24. Pivot point 24 is located on the side of the housing that is associated with the distributors 32 having the connector elements 17. On the end of the functional printed circuit board 7 that is located opposite the pivot point, the functional printed circuit 7 that is located opposite the pivot point, the functional printed circuit board 7 and the lid 4 are attached via a catch hook 27 to the housing of the field bus connection module.

The housing contains a recess 18 adjacent the functional printed circuit board 10 on the bus conductor side. The recess enables the bus conductor (not shown) to be connected with the circuit board 10 via a plug connection. The functional printed circuit board 10 is inserted into a pair of aligned slots 28 in the terminal blocks of the module after the feed block 12 and spacing elements 13 are aligned on the mounting rail 1, but before the grounded conductor block 11 is aligned to complete the module assembly.

The lid 4 has a catch projection 2 on its front edge that extends parallel to the mounting rail 1 and that corresponds to catch hook 27 on spacing disks 13 and that facilitates a unilateral clamping arrangement of the functional printed circuit board 7 and the lid 4. On the other edge of the housing, there is provided in an analogous manner a receiving console 23 which grasps the housing lid 4 and which, together with catch projection 2, permits the bilateral grasping of the lid 4. For removal, the lid 4 is swung out around a common pivotal point 24 and can then be removed in the same manner as the circuit board 7 is removed.

The lid 4 and the functional printed circuit board 7 on the field bus conductor side are locked onto the housing by means of catch hooks 3 on the lid. The hooks are arranged by way of an extension of the outside wall of the lid 4 that extends toward the side surfaces of the housing. There is provided a skirt that is arranged on both sides of these side surfaces and that is drawn down and upon which are arranged the catch hooks 3 on the inside of the lid, behind which the functional printed circuit board 7 is locked.

Figure 3:
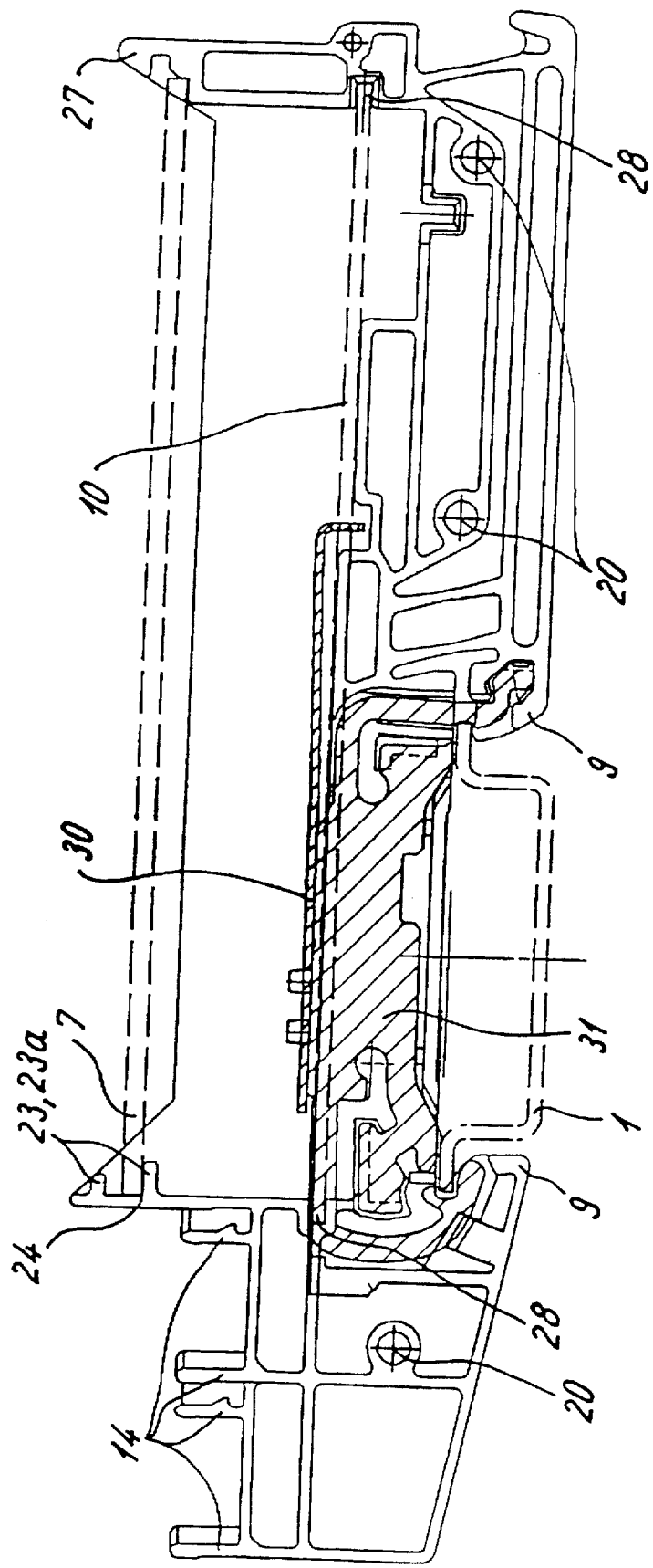
FIG. 3 is a side plan view of a grounded conductor block of the module of FIG. 1.

FIGS. 2 to 4 illustrate the terminal blocks that form the housing of the field bus connection module. The same elements are labeled with the same reference numbers.

In FIG. 2 there is shown a feed terminal block 12 that is mounted on a mounting rail 1 via catches 9. The feed block contains alignment holes 20 for aligning the block via alignment pins with spacing elements and a conductor block to form a module. On the supply side of the field bus connection module, there are shown connectors 16 into which one can plug supply cables from above into corresponding recesses and that can be attached by means of clamping elements 22, although any other commercial fastening system for cables may be used. Connectors 16 are arranged in catch and guide elements 14 on the housing of feed block 12 and are locked thereto. The connectors 16 are aligned next to each other with the neighboring connectors to form a distributor 32. The connectors are also cross-connected in a known fashion.

On the underside of one of the connectors 16 there is provided a contact bar 21 and, on the other connection element, there is provided a contact bar 19, both of which lead to the bus-conductor-side functional printed circuit board 10 and can be fixed in position on corresponding contacts. The supply voltage that is supplied to the connectors 16 from a remote voltage supply, not shown, is conducted to the bus-conductor side functional printed circuit board 10, and the bus conductor is thus electrically connected. Functional printed circuit board 10, which is arranged on the bus conductor side is guided in insertion slots 28 and is enclosed by the rear wall of the feed block 12. In the rear wall, there is provided a holding bar 26 that stabilizes the contact bar 21. Functional printed circuit board 10 is supported by a support rib 25 that braces the board against mechanical stresses. Above the functional printed circuit board 10, the field-bus-side functional printed circuit board 7 is so arranged that it will rest on the receiving console 23 and on the opposite side underneath a catch hook 27 on the housing side, while above receiving console 23 there is also provided a slightly recessed receiving console 23a that makes it impossible to remove the functional printed circuit board 7 vertically without rotation around a swing reference point 24. To remove the functional printed circuit board 7, the latter is swung around the reference point 24 and is then extracted laterally under the upper receiving console 23a. The field-bus-side functional printed circuit board 7 is fixed in position by the housing lid 4 that rests directly on the upper surface of the functional printed circuit board 7 and that can be swung under the upper receiving console 23a and under the catch hook 27 and that can be fixed in position.

FIG. 3 shows a grounded conductor block 11 that has basically the identical structure as does the feed block 12. Performing a different function, however, the electrical connection of the grounded conductor block 11 with the mounting rail 1 is provided by a sheet metal contact 31 that can necessarily be fixed on the mounting rail. The top of the contact 31 includes a contact bar 30 that can be fixed in an electrically conducting manner upon the bus-conductor-side functional printed circuit board is directly connected to the mounting rail 1. Catches 9 at the bottom of the conductor block 11 mechanically mount the block on the rail.

In FIG. 4 there is shown a spacing element 13 formed of a plurality spacing disks. The lid 4 is inserted in the receiving console 23 and catch 27 and the functional printed circuit board 7 is fixed in position. The spacing discs do not have any catches for the mounting rail 11. Rather, they have only stops 29 that facilitate the positioning of the spacing discs. Arranged on the field-bus-side functional printed circuit board 7 are field bus plugs 5 or direct wiring bases 6 above which openings 15 are provided on the top of the lid.

While in accordance with the provisions of the U.S. patent laws the preferred forms and embodiments have been illustrated and described, it will become apparent to those of ordinary skill in the art that various changes and modifications may be made without deviating from the inventive concepts set forth above.

What is claimed is:

1. A field bus connection module for coupling a local bus conductor with a field bus system, comprising
    (a) a housing formed of a plurality of aligned terminal blocks comprising at least one feed block (12), at least one grounded conductor block (11), and at least one spacing element (13);
    (b) at least one functional printed circuit board (7) removably mechanically connected with said housing and for adapting signals of the local bus conductor to the field bus system;
    (c) first connection means (10) for removably electrically connecting said functional printed circuit board with the local bus connector; and
    (d) second connection means (5,6) for electrically connecting said functional printed circuit board with the field bus system, whereby when said functional printed circuit board is removed from said housing, said the electrical connection with the local bus connect or is severed and said second connection means maintain the electrical connection with the field bus system.

2. A field bus connector module as defined in claim 1, wherein said terminal blocks are arranged in a sequence of at least one feed block, at least one spacing element, and at least one grounded conductor block.

3. A field bus connection module as defined in claim 2, wherein said housing comprises at least two spacing elements, feed blocks, and grounded conductor blocks.

4. A field bus connector module as defined in claim 2, wherein said housing comprises a plurality of spacing elements.

5. A field bus connection module as defined in claim 4, wherein each spacing element has a generally planar configuration corresponding with said conductor and feed blocks.

6. A field bus connection module as defined in claim 1, and further comprising a lid (4) removably connected with said housing and covering said functional printed circuit board.

7. A field bus connection module as defined in claim 6, wherein said housing includes a pivot (24) about which said functional printed circuit board can be moved for attaching and removing said lid with respect to said housing.

8. A field bus connection module as defined in claim 7, wherein said second connection means comprises a plug connection mounted on said functional printed circuit board.

9. A field bus connection module as defined in claim 8, wherein said functional printed circuit board can be removed with said lid from said housing.

10. A field bus connection module as defined in claim 8, wherein said plug connector comprises a standard field bus plug.

11. A field bus connection module as defined in claim 8, wherein said second connection means further comprises a wiring connection (6) mounted on said functional printed circuit board for directly wiring field bus cables with said housing.

12. A field bus connection module as defined in claim 11, wherein and said plug connector and said wiring connector are electrically connected to form a direct wire connection.

13. A field bus connector module as defined in claim 6, wherein said lid is removable from said housing without said functional printed circuit board, said functional printed circuit board maintaining a connection between the local bus conductor and the field bus when said lid is removed.

14. A field bus connection module as defined in claim 6, wherein said lid contains openings (15) for passage of field bus connector cables and plugs.

15. A field bus connection module as defined in claim 1, wherein a pair of separably connected functional printed circuit boards are provided for coupling the field bus system and the local bus conductor.

16. A field bus connection module as defined in claim 15, wherein said functional printed circuit board arranged adjacent the field bus system includes said second connection means for the field bus system.

17. A field bus connection module as defined in claim 16, wherein said functional printed circuit board arranged adjacent the local bus conductor includes all functions for signal adaption.

18. A field bus connection module as defined in claim 16, and further comprising a lid removably connected with said housing, said functional printed circuit board arranged adjacent said field bus system being attached to said lid and removable therewith to disconnect said functional printed circuit boards.

19. A field bus connection module as defined in claim 15, wherein said functional printed circuit boards are arranged in planes parallel to a plane containing a bottom surface of said housing.

20. A field bus connection module as defined in claim 17, wherein said functional printed circuit board arranged adjacent the local bus conductor is plugged firmly in said housing and is electrically connected with said feed block for distribution for the bus conductor.

21. A field bus connection module as defined in claim 1, and further comprising a plurality of pluggable connection elements (17) connected with said housing for receiving a plurality of distributors (32) for tapping connection blocks associated with said housing.

22. A field bus connection module as defined in claim 21, wherein said feed block includes means (14) for receiving said distributors and means (9) for mounting said feed block on a mounting rail.

23. A field bus connection module as defined in claim 22, wherein said grounded conductor block includes means (9) for mounting said conductor block on the mounting rail and for establishing an electrical contact between the bus conductor and the mounting rail.

24. A field bus connection module as defined in claim 23, wherein additional spacing elements are provided to increase the depth of said housing in order to accommodate longer functional printed circuit boards.

25. A field bus connection device as defined in claim 24, wherein said spacing elements include stops (29) for positioning said spacing elements relative to a mounting rail.

* * * * *